(12) United States Patent
Ha

(10) Patent No.: US 8,812,928 B2
(45) Date of Patent: Aug. 19, 2014

(54) MEMORY DEVICE AND MEMORY CONTROL UNIT

(75) Inventor: Kae-Won Ha, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 232 days.

(21) Appl. No.: 13/368,352

(22) Filed: Feb. 8, 2012

(65) Prior Publication Data

US 2012/0216095 A1    Aug. 23, 2012

(30) Foreign Application Priority Data

Feb. 18, 2011    (KR) .................. 10-2011-0014754

(51) Int. Cl.
| | |
|---|---|
| *H03M 13/00* | (2006.01) |
| *H03M 13/09* | (2006.01) |
| *H03M 13/11* | (2006.01) |
| *G06F 11/10* | (2006.01) |

(52) U.S. Cl.
CPC .............. *H03M 13/09* (2013.01); *H03M 13/11* (2013.01); *G06F 11/1004* (2013.01)
USPC .......................... 714/758; 714/798; 714/799

(58) Field of Classification Search
CPC ... H03M 13/11; H03M 13/09; H03M 13/091; H03M 13/25; H03M 13/03; H04L 1/0061; H04L 1/0057; H04L 1/0078; H04L 7/048; G06F 11/00; G06F 11/1004
USPC ......... 714/763, 710, 718, 752, 181, 758, 799, 714/798, 807; 360/26, 36.1, 47; 365/200, 365/201
See application file for complete search history.

(56) References Cited

U.S. PATENT DOCUMENTS

| | | | | |
|---|---|---|---|---|
| 5,282,215 | A  * | 1/1994  | Hyodo et al. ................. | 714/775 |
| 6,003,151 | A  * | 12/1999 | Chuang ........................ | 714/752 |
| 6,012,839 | A  * | 1/2000  | Nguyen et al. ................ | 714/755 |
| 6,681,362 | B1 * | 1/2004  | Abbott et al. ................. | 714/755 |
| 8,190,974 | B2 * | 5/2012  | Gruner et al. ................. | 714/773 |
| 2003/0095606 | A1 * | 5/2003 | Horowitz et al. ............. | 375/286 |
| 2008/0225603 | A1 * | 9/2008 | Hein ........................ | 365/189.05 |
| 2009/0216939 | A1 | 8/2009 | Smith et al. | |
| 2009/0235113 | A1 * | 9/2009 | Shaeffer et al. .................. | 714/5 |
| 2009/0300278 | A1 | 12/2009 | Kruger | |

FOREIGN PATENT DOCUMENTS

KR    100929836 B1    11/2009

* cited by examiner

*Primary Examiner* — Albert Decady
*Assistant Examiner* — Osman Alshack
(74) *Attorney, Agent, or Firm* — Volentine & Whitt, PLLC

(57) ABSTRACT

A memory device is configured to generate a signal having a temperature compensation function. The device includes a mode register configured to store error detection and correction (EDC) mode data, and an EDC pattern generator configured to receive pattern information and period information included in the mode data and to generate an EDC pattern signal based on the pattern information and the period information. The EDC pattern signal is a periodic signal obtained by repeating a signal pattern based on the pattern information at a periodic rate corresponding to a signal period based on the period information. In some cases, the EDC pattern signal may be disabled during a portion of the signal period.

20 Claims, 15 Drawing Sheets

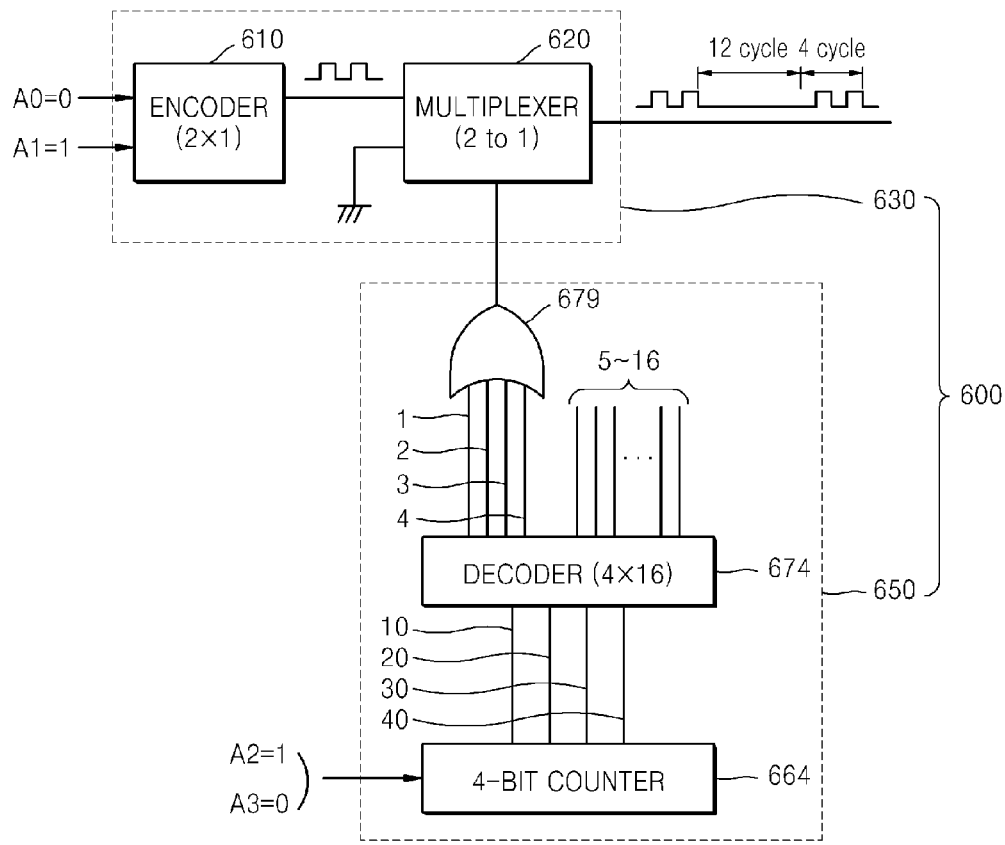

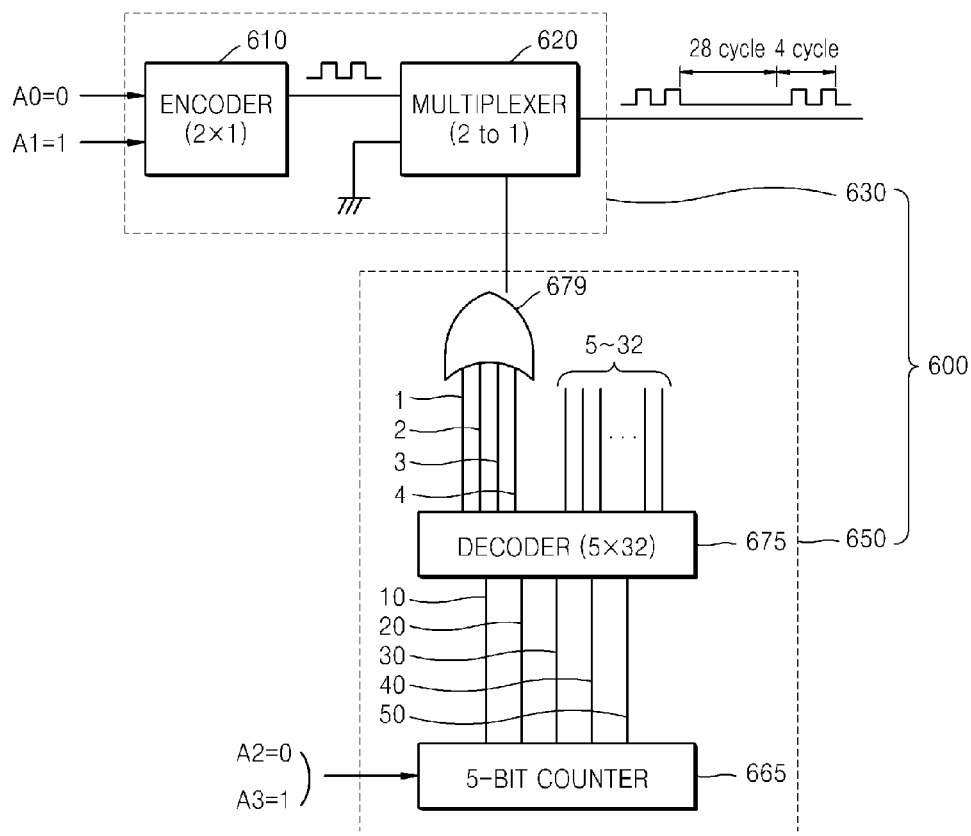

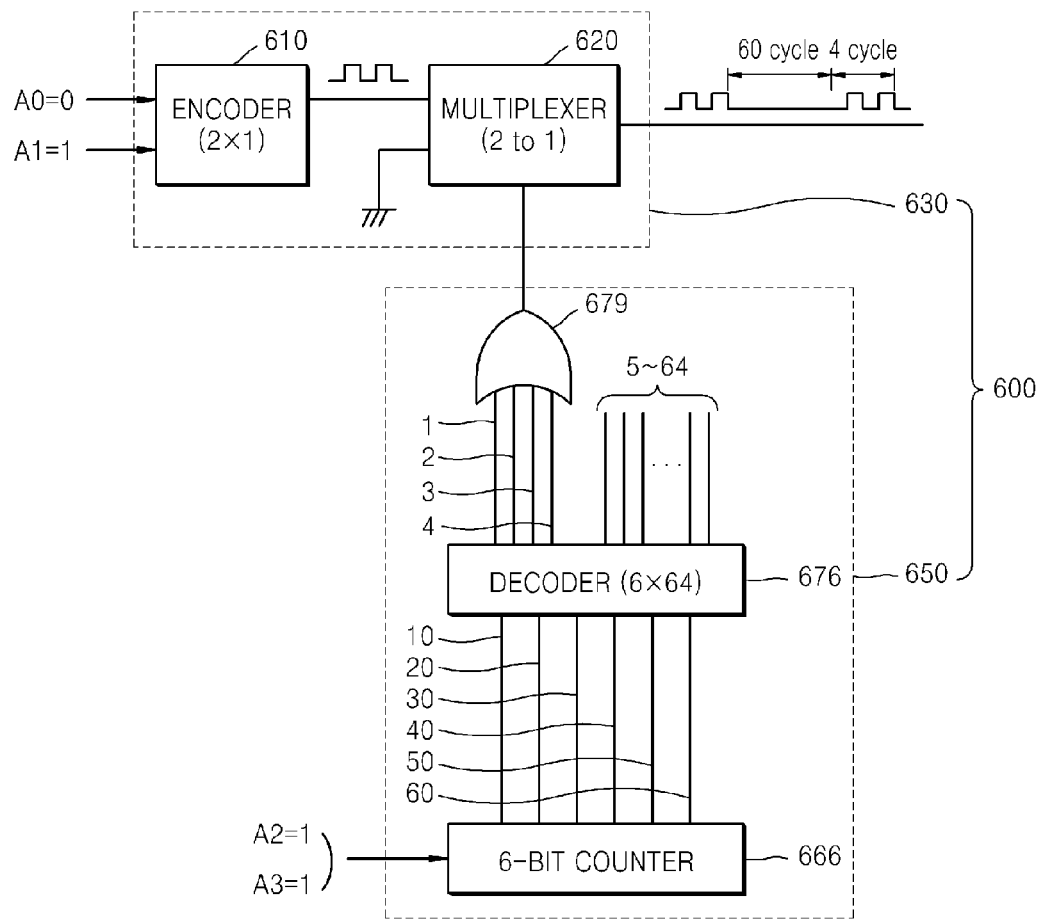

MEMORY DEVICE AND MEMORY CONTROL UNIT

CROSS-REFERENCE TO RELATED APPLICATIONS

This application claims the benefit of Korean Patent Application No. 10-2011-0014754, filed on Feb. 18, 2011, in the Korean Intellectual Property Office, the disclosure of which is incorporated herein in its entirety by reference.

BACKGROUND

The inventive concept relates to a memory device and a memory control unit, and more particularly, to a memory device configured to generate a signal to serve a temperature compensation function and a memory control unit connected to the memory device.

A memory device, such as a double-data-rate synchronous dynamic random access memory (DDR SDRAM), may receive a clock signal, a command signal, an address signal, and a data signal from a memory control unit and perform various operations, typically, a read operation and a write operation. During the write operation, the memory device may store data in a memory cell corresponding to an address signal applied from the memory control unit. Also, during the read operation, the memory device may output stored data to a memory cell corresponding to an address signal applied from the memory control unit.

SUMMARY

The inventive concept provides a memory device configured to generate a signal to produce a temperature compensation effect and a power reduction effect, and a memory control unit having a temperature compensation effect and a power reduction effect.

According to an aspect of the inventive concept, there is provided a memory device including: a mode register configured to store error detection and correction (EDC) mode data, including pattern information and period information for an EDC pattern; and an EDC pattern generator configured to receive the pattern information and the period information and to generate the EDC pattern signal based on the pattern information and the period information. The EDC pattern signal is a periodic signal comprising a series of signal periods based on the period information, wherein at least one signal period includes an active period and a hold period, wherein the EDC pattern signal includes in the active period a signal pattern based on the pattern information, and wherein the EDC pattern signal is in a disabled state during the hold period.

The pattern information comprises a first EDC pattern signal parameter including first EDC pattern signal parameter bits, the signal pattern is obtained by repeating the first EDC pattern signal parameter bits during the active period.

The EDC pattern generator includes: a synthesizer configured to receive the first EDC pattern signal parameter bits and to output the first EDC pattern signal; and a control signal generator configured to output a periodic operation signal to the synthesizer wherein a period of the operation signal is based on the period information.

The synthesizer may be further configured to output the first EDC pattern signal parameter bits when the operation signal is enabled, and wherein the synthesizer outputs a ground signal when the operation signal is disabled.

The period information comprises a second EDC pattern signal parameter including second EDC pattern signal parameter bits, the operation signal may be enabled for a first period when one of the second bit signal is enabled, and the operation signal may be enabled for a second period different from the first period when one of the second EDC pattern signal parameter bits is disabled.

The control signal generator may include a counter.

The memory device may further include: at least one memory cell; a data pin connected to the at least one memory cell and configured to transmit a data signal to the at least one memory cell; and a cyclic-redundancy-check (CRC) signal generator connected to the data pin and configured to generate CRC information regarding the data signal.

The EDC pattern generator may be connected to the CRC signal generator and further configured to generate the EDC pattern signal including the CRC information.

According to another aspect of the inventive concept, there is provided a device including: a mode register configured to store error detection and correction (EDC) mode data including pattern information and period information; a synthesizer configured to generate a periodic EDC pattern signal for receiving data stored in the at least one memory cell, wherein the EDC pattern signal has a signal period based on the period information, and has a signal pattern based on the pattern information; and a control signal generator configured to generate an operation signal for the synthesizer at intervals of the signal period based on the period information. The EDC pattern signal generated by the synthesizer is a signal obtained by repeating the signal pattern at a periodic rate corresponding to the signal period.

According to another aspect of the inventive concept, there is provided a memory control unit including: a mode signal generator configured to generate a mode signal including pattern information and period information; and a first synchronizer configured to generate a clock signal and synchronize an edge of the clock signal with an edge of an EDC pattern signal received from an EDC pin. The EDC pattern signal is a periodic signal obtained by repeating a signal pattern obtained based on the pattern information at intervals of a signal period obtained based on the period information.

The first synchronizer may further configured to synchronize the edge of the clock signal with the edge of the EDC pattern signal for the signal period obtained based on the period information.

The memory control unit may further include a hold information generator configured to receive the period information and generate an operation signal of the first synchronizer, and the operation signal may be enabled for the signal period obtained based on the period information.

The memory control unit may further include: a data line connected to a controller and configured to transmit a data signal to the controller; and a CRC signal generator connected to the data line and generate CRC information regarding the data signal.

The memory control unit may further include a detector configured to compare a second CRC signal generated by the CRC signal generator with a first CRC signal included in the EDC pattern signal received from the EDC pin and detect a transmission error.

According to another aspect of the inventive concept, there is provided a method of driving a memory control unit including: receiving an EDC pattern signal; and synchronizing an edge of the EDC pattern signal with an edge of a clock signal. The EDC pattern signal may be a periodic signal obtained by repeating a signal pattern obtained based on pattern information at a periodic rate based on period information.

According to yet another aspect of the inventive concept, there is provide an apparatus comprising: a first device, including at least one input configured to receive error detection and correction (EDC) mode data, including pattern information and period information for an EDC pattern signal; an error detection and correction (EDC) generator configured to generate an EDC pattern signal based on the EDC mode data; and at least one output configured to output the EDC pattern signal. In a synchronization mode, the EDC pattern signal is a periodic signal comprising a series of signal periods based on the period information, wherein at least one signal period includes an active period and a hold period, wherein the EDC pattern signal includes in the active period a signal pattern based on the pattern information, and wherein the EDC pattern signal remains at a fixed logic level throughout a duration of the hold period.

In some embodiments, the first device is a memory device further comprising: at least one memory cell; at least one data pin configured to output data from the at least one memory cell; and a first cyclic-redundancy-check (CRC) signal generator configured to generate first CRC information regarding the output data, wherein the CRC signal generator is operatively connected to the EDC pattern generator, and wherein, in a data transmission mode, the EDC pattern signal includes the CRC information.

In some embodiments, the memory device further comprises a mode register configured to store the EDC data.

In some embodiments, the apparatus further comprises a memory control unit operatively connected to the memory device, and wherein the memory control unit comprises a mode signal generator configured to transmit the EDC mode data to the memory device.

In some embodiments, the memory control unit further comprises a first synchronizer configured, in the synchronization mode, to synchronize a clock of the memory control unit to the signal pattern of the EDC pattern signal received from the at least one output of the memory device.

In some embodiments, the memory control unit further comprises: a second CRC signal generator configured to derive second CRC information from the output data of the memory device; and a detector configured, in the data transmission mode, to receive the EDC pattern signal and to extract the first CRC information therefrom, and to receive the second CRC information from the second CRC signal generator, and to compare the first CRC information to the second CRC information to determine where the output data is received correctly.

In some embodiments, the memory control unit further comprises a multiplexer configured to receive the EDC pattern signal and, in response to a synchronous mode signal, to selectively provide the EDC pattern signal to one of the first synchronizer and the detector.

BRIEF DESCRIPTION OF THE DRAWINGS

Exemplary embodiments of the inventive concept will be more clearly understood from the following detailed description taken in conjunction with the accompanying drawings in which:

FIG. 11 is a schematic construction diagram of an EDC pattern generator configured to generate an EDC pattern signal repeated at a period of 16 cycles, according to a modified embodiment of the memory device of FIG. 9;

FIG. 12 is a schematic diagram of an operation of a decoder of FIG. 11;

FIG. 13 is a schematic construction diagram of an EDC pattern generator configured to generate an EDC pattern signal repeated at a period of 32 cycles, according to a modified embodiment of the EDC pattern generator of FIG. 11;

FIG. 14 is a schematic diagram of an operation of a decoder of FIG. 13;

FIG. 15 is a schematic construction diagram of an EDC pattern generator configured to generate an EDC pattern signal repeated at a period of 64 cycles, according to a modified embodiment of the EDC pattern generator of FIG. 13;

FIG. 16 is a schematic diagram of an operation of a decoder of FIG. 15;

DETAILED DESCRIPTION OF THE EMBODIMENTS

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments of the present inventive concept are described herein with reference to plan and cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing.

Figure 1:
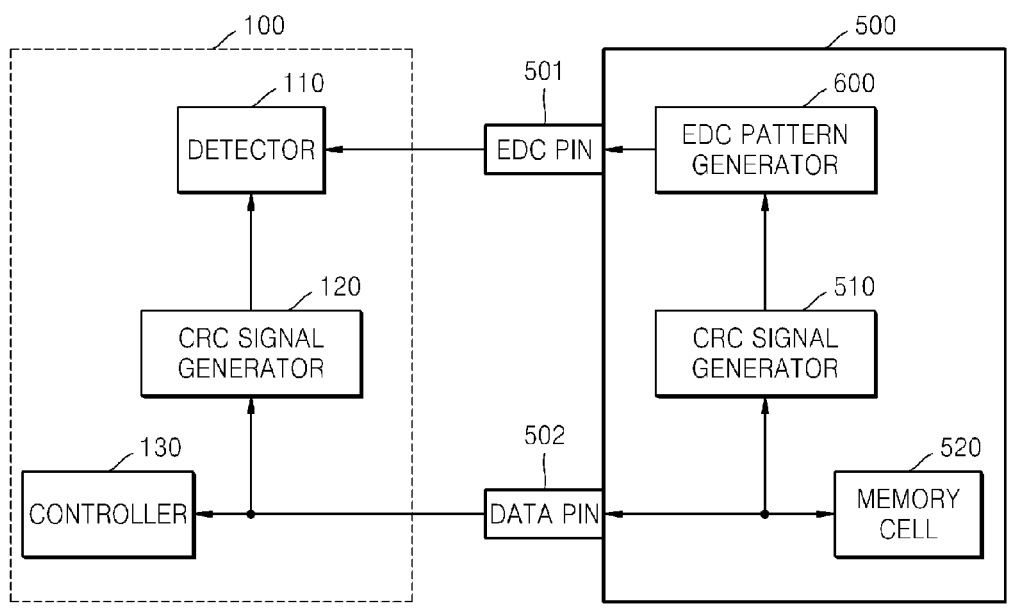
FIG. 1 is a block diagram of a memory device and a memory control unit according to exemplary embodiments of the inventive concept.

FIG. 1 is a block diagram of a memory device 500 and a memory control unit 100 according to embodiments of the inventive concept.

Referring to FIG. 1, the memory device 500, for example, may be a memory device compatible with a graphics double data rate (GDDR) 5 standard. In this case, memory device 500 may support an error detection and correction (EDC) function.

The EDC function may be implemented in response to an EDC pattern signal transmitted by an EDC pin 501. The EDC function may be performed using a cyclic redundancy check (CRC) algorithm broadly employed for a high-speed communication network so that bit errors in a data signal can be detected.

Memory device 500 may include one or more memory cells 520, a CRC signal generator 510, and an EDC pattern generator 600. Memory control unit 100 may include a controller 130, a CRC signal generator 120, and a detector 110.

Memory device 500 may receive a data signal from a data pin 502 connected to the memory control unit 100 and store the data signal in memory cell 520, or receive a data signal from data cell 520 and transmit the data signal through data pin 502 to memory control unit 100.

CRC signal generator 510 of memory device 500 may be connected to data pin 502 and receive the data signal. Also, CRC signal generator 510 may be configured to generate a CRC signal based on the data signal. EDC pattern generator 600 may receive the CRC signal from CRC signal generator 510 and generate the EDC pattern signal including the CRC signal. The generated EDC pattern signal may be transmitted through EDC pin 501 to memory control unit 100.

Memory control unit 100 may be configured to receive the data signal from memory device 500 and transmit the data signal to controller 130. The data signal transmitted through a data line (not shown) may be also connected with CRC signal generator 120 of the memory control unit 100. CRC signal generator 120 of the memory control unit 100 may be connected with the data line and configured to receive the data signal from the data line and generate a CRC signal using the data signal. CRC signal generator 120 of memory control unit 100 and CRC signal generator 510 of memory device 500 may employ the same CRC algorithm.

Detector 110 may compare the CRC signal generated by CRC signal generator 120 of memory control unit 100 with the CRC signal generated by CRC signal generator 510 of memory device 500 and detect transmission errors. More specifically, the CRC signal generated by CRC signal generator 120 of memory control unit 100 may be compared with the CRC signal included in the EDC pattern signal received from EDC pin 501 to detect the transmission errors.

When a transmission error occurs, memory control unit 100 may generate signals to instruct memory device 500 to read and write the data signal again, and thus, memory device 500 may perform memory read and write operations again. In view of the fact that only memory control unit 100 is used to detect the transmission error, while memory device 500 performs read and write operations irrespective of the presence or absence of transmission errors, the above-described operations may be referred to as an asymmetric procedure.

Figure 2:
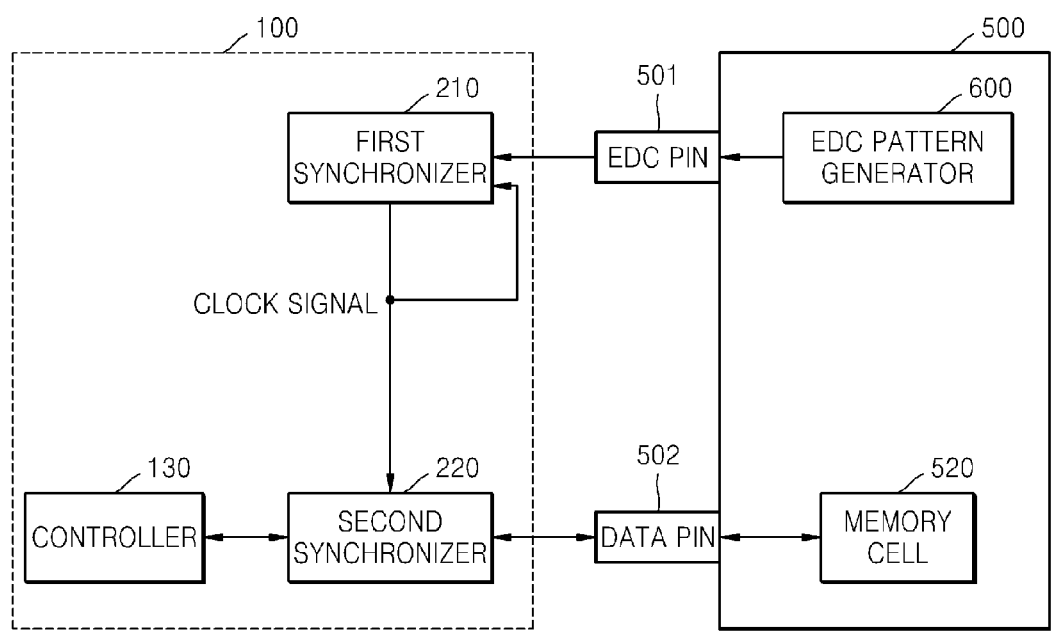
FIG. 2 is a block diagram of a memory device and a memory control unit according to other exemplary embodiments of the inventive concept.

FIG. 2 is a block diagram of memory device 500 and memory control unit 100 according to other exemplary embodiments of the inventive concept. Memory device 500 and memory control unit 100 of FIG. 2 may be modified examples of memory device 500 and memory control unit 100 of FIG. 1. Hereinafter, a repeated description of the same components as in FIG. 1 will be omitted.

Referring to FIG. 2, memory control unit 100 may monitor an EDC pattern signal transmitted by EDC pin 501 and observe and compensate for a data eye drift of a data signal transmitted from data pin 502 to a data line (not shown). This operation may be referred to as a clock-and-data-recovery (CDR) operation, which may prevent distortion of data of the data signal caused by a variation in the temperature of memory control unit 100.

More specifically, memory control unit 100 may include a first synchronizer 210 and a second synchronizer 220. Each of the first and second synchronizers 210 and 220 may include a clock data recovery (CDR) circuit, a phase locked loop (PLL) circuit, and/or a delay locked loop (DLL) circuit.

First synchronizer 210 may generate a clock signal which is fed back to itself, and synchronize an edge of the clock signal with an edge of the EDC pattern signal received from EDC pin 501 to restore the clock signal. The clock signal from first synchronizer 210 may be synchronized by second synchronizer with the data signal transmitted from data pin 502 220 to ensure a high immunity to noise caused by a temperature variation.

Figure 3:
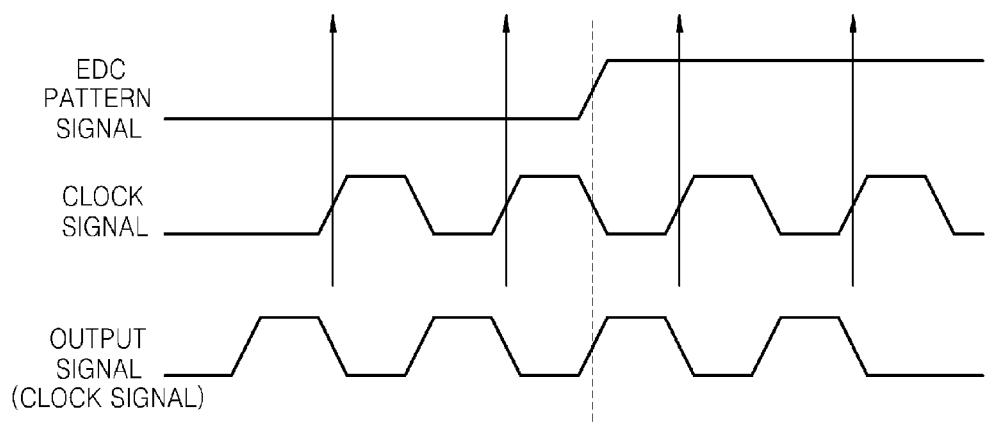
FIGS. 3 and 4 are signal waveform diagrams of an operation of a first synchronizer of FIG. 2.
Figure 4:
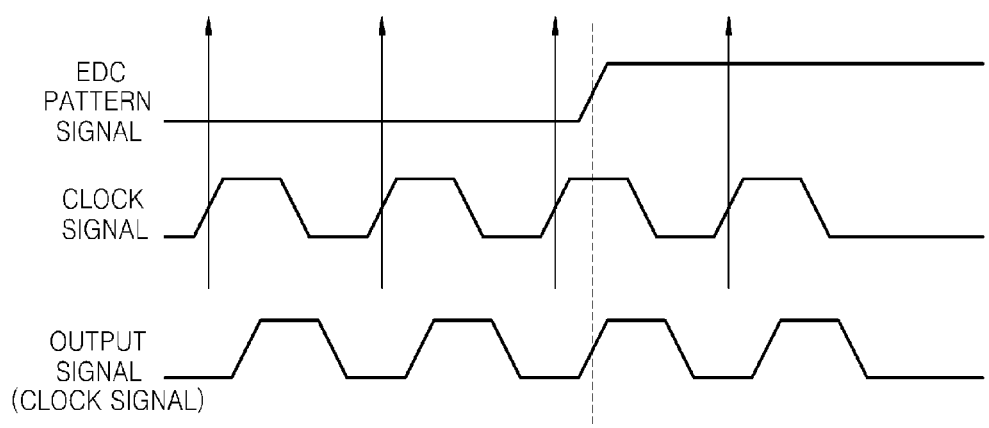

FIGS. 3 and 4 are signal waveform diagrams of an operation of first synchronizer 210 of FIG. 2.

Referring to FIGS. 3 and 4, first synchronizer 210 may determine whether the EDC pattern signal transmitted from the EDC pin 501 is synchronized with the clock signal, which is an output signal of first synchronizer 210.

For example, first synchronizer 210 may detect levels of the EDC pattern signal at points in time when a rising edge of the clock signal occurs. The detected levels of the EDC pattern signal may be compared with EDC information stored in a storage unit (not shown).

For example, as shown in FIG. 3, the stored EDC information may be '0011', and the level of the EDC pattern signal detected at the point in time when the rising edge of the clock signal occurs may be '0011'. In this case, it may be determined that the clock signal is later than the EDC pattern signal. When the clock signal is late, first synchronizer 210 may advance the phase of the clock signal by a predetermined amount of time so that a rising edge of the EDC pattern signal can be synchronized with the rising edge of the clock signal.

As shown in FIG. 4, the stored EDC information may be '0011', and the level of the EDC pattern signal detected at the point in time when the rising edge of the clock signal occurs may be '0001'. In this case, it may be determined that the clock signal is earlier than the EDC pattern signal. When the clock signal is early, first synchronizer 210 may retard the phase of the clock signal by a predetermined amount of time so that the rising edge of the EDC pattern signal can be synchronized with the rising edge of the clock signal.

Figure 5:
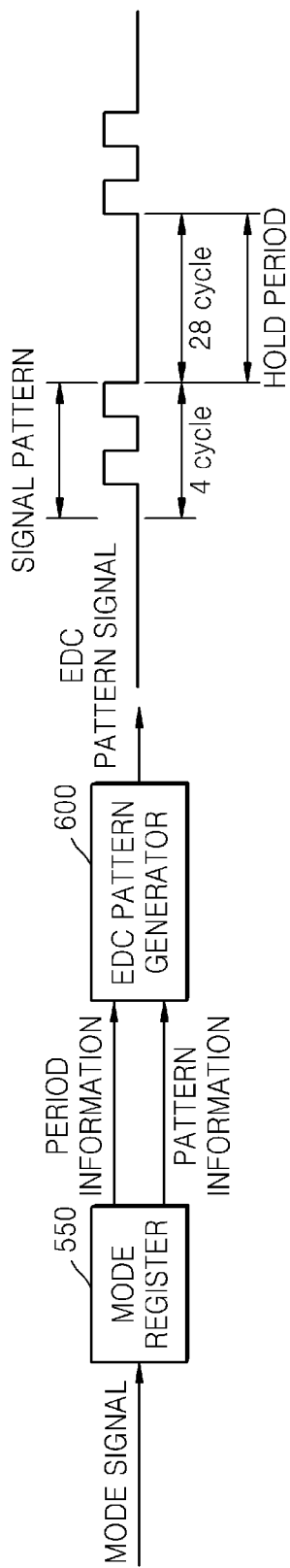
FIG. 5 is a block diagram of a memory device according to an embodiment of the inventive concept.

FIG. 5 shows a block diagram of memory device 500 according to an embodiment of the inventive concept. Memory device 500 of FIG. 5 may be a modified example of the memory device 500 shown in FIG. 1 or 2. Hereinafter, a repeated description of the same components as in FIG. 1 or 2 will be omitted.

Referring to FIG. 5, memory device 500 may include a mode register 550 and EDC pattern generator 600.

Mode register 550 may store EDC mode data, including period information and pattern information required to generate an EDC pattern signal. More specifically, mode register 550 may receive an EDC mode signal through an address pin (e.g., address pin 503 shown in FIG. 6) from a memory control unit (e.g., memory control unit 100 shown in FIG. 6) and store the EDC mode data included in the EDC mode signal.

EDC pattern generator 600 may receive the pattern information and the period information included in the EDC mode signal from mode register 550 and may generate the EDC pattern signal based on the pattern information and the period information.

The EDC pattern signal generated by EDC pattern generator 600 may be a signal having a signal pattern obtained based on the pattern information, for a signal period obtained based on the period information, as indicated in the EDC mode signal. More specifically, the pattern information may include a first EDC pattern signal parameter specified by first EDC pattern signal parameter bits. In this case, the EDC pattern signal may be a signal obtained by repeating a signal pattern generated from the first EDC pattern signal parameter bits, at intervals of the signal period obtained based on the period information. The EDC pattern signal may be in a disabled state at the intervals of the signal period between signal patterns.

For example, the pattern information may include a signal pattern '0101'. The EDC pattern signal may be a periodic signal wherein the signal pattern is repeated at a signal period of 32 cycles (with a hold period of 28 cycles between adjacent signal patterns '0101') based on the period information. Accordingly, the EDC pattern generator 600 may generate the EDC pattern signal, which is repeated at a signal period of 32 cycles, enabled with a signal pattern of '0101' for 4 cycles, and disabled (i.e., in a state of '0') for 28 cycles.

Figure 6:
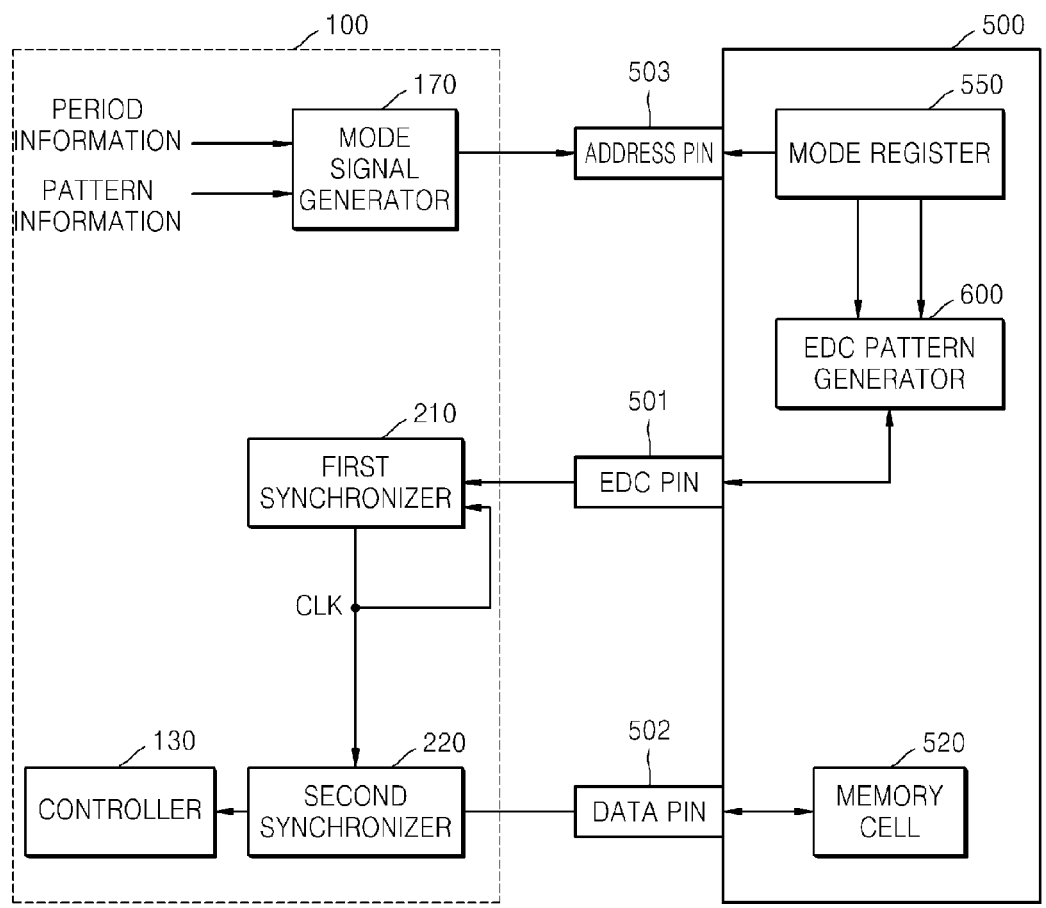
FIG. 6 is a block diagram of a memory device and a memory control unit according to other exemplary embodiments of the inventive concept.

FIG. 6 is a block diagram of memory device 500 and memory control unit 100 according to other exemplary embodiments of the inventive concept. Memory device 500 and memory control unit 100 of FIG. 6 may be modified examples of memory device 500 and memory control unit 100 of FIGS. 2 through 5. Hereinafter, a repeated description of the same components as in FIGS. 2 through 5 will be omitted.

Referring to FIG. 6, as described above with reference to FIG. 5, memory device 500 may include mode register 550 and EDC pattern generator 600. An EDC mode signal generated by mode signal generator 170 of memory control unit 100 may be transmitted through address pin 503 to memory device 500, and EDC mode register 550 may store EDC mode data included in the EDC mode signal. The EDC mode signal may include period information and pattern information required to generate an EDC pattern signal.

In addition, as described with reference to FIGS. 2 through 5, the EDC pattern signal generated by EDC pattern generator 600 may be applied through EDC pin 501 to first synchronizer 210. First synchronizer 210 may synchronize an edge of a clock signal with an edge of the EDC pattern signal received from EDC pin 501. The clock signal synchronized with the EDC pattern signal may be applied to second synchronizer 220. Second synchronizer 220 may synchronize the clock signal with the data signal transmitted through data pin 502.

Owing to a variation in the temperature of memory device 500 or memory control unit 100, signal distortion, such as timing skew, may occur in the data signal transmitted by data pin 502. In this case, first synchronizer 210 may synchronize the EDC pattern signal with the clock signal, and second synchronizer 220 may synchronize the synchronized clock signal with a data signal having the timing skew and compensate for a data eye drift in the data signal.

Furthermore, memory device 500 according to the inventive concept may generate the EDC pattern signal obtained by repeating a signal pattern obtained based on pattern information for a signal period obtained based on the period information. Thus, the EDC pattern signal may remain disabled at intervals of the signal period in between adjacent signal patterns, and the number of toggling times of the EDC pattern signal can minimized. As a result, power reduction may be attained.

Figure 7:
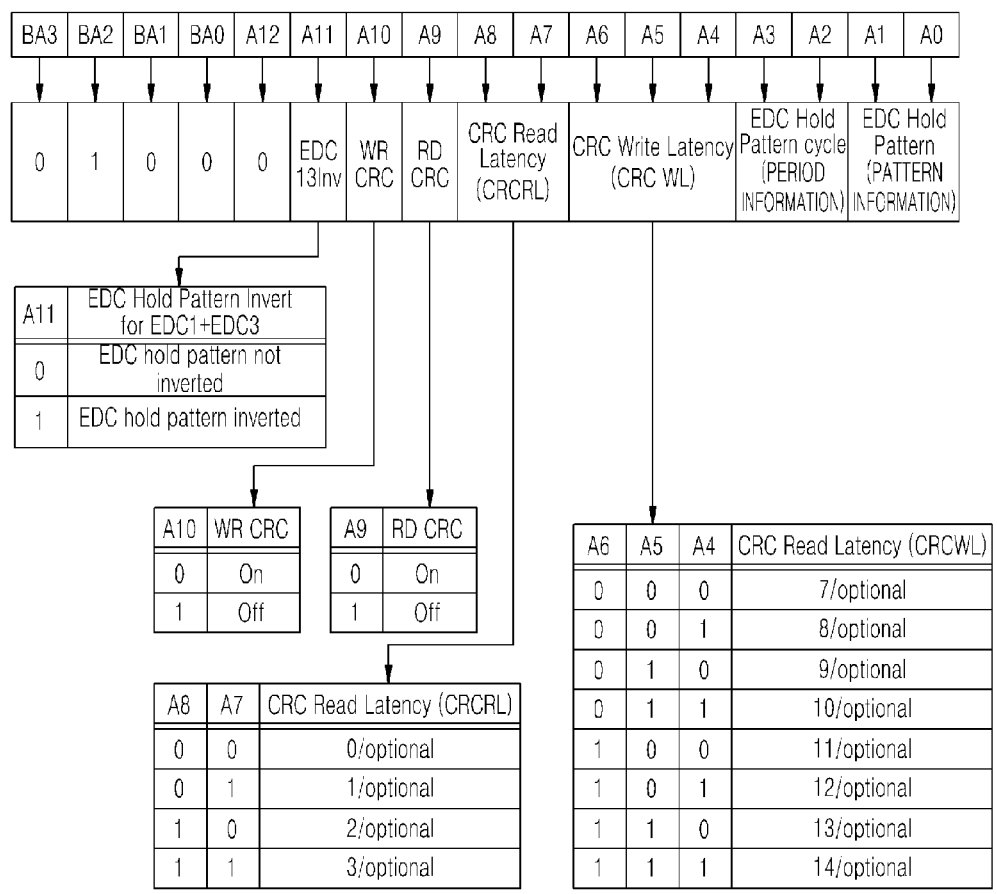
FIG. 7 illustrates EDC mode data stored in a mode register of a memory device according to exemplary embodiments of the inventive concept.

FIG. 7 EDC mode data stored in an EDC mode register of a memory device according to exemplary embodiments of the inventive concept.

Referring to FIG. 7, information stored in EDC mode addresses A3 to A0 will be noted. EDC mode data stored in the EDC mode register may include a plurality of EDC pattern signal parameters. For example, the EDC mode data may include at least one first EDC pattern signal parameter specified by first EDC pattern signal parameter bits A0 and A1 indicating pattern information, and at least one second EDC pattern signal parameter specified by second EDC pattern signal parameter bits A2 and A3 indicating period information.

More specifically, for example, the first EDC pattern signal parameter represented by first EDC pattern signal parameter bits A0 and A1 indicating the pattern information may be defined as shown in Table 1.

TABLE 1

| A1 | A0 | Meaning (Example) |
|----|----|-------------------|
| 0 | 0 | Generation of signal pattern '0000' |
| 0 | 1 | Generation of signal pattern '0101' |
| 1 | 0 | Generation of signal pattern '1010' |
| 1 | 1 | Generation of signal pattern '1111' |

In addition, for example, the second EDC pattern signal parameter represented by second EDC pattern signal parameter bits A2 and A3 indicating the period information may be defined as shown in Table 2.

TABLE 2

| A3 | A2 | Meaning (Example) |
|----|----|-------------------|
| 0 | 0 | No hold (continuous repetition of signal pattern) |
| 0 | 1 | 12 cycle hold period (signal period of 16 cycles) |
| 1 | 0 | 28 cycle hold period (signal period of 32 cycles) |
| 1 | 1 | 60 cycle hold period (signal period of 64 cycles) |

As defined in Tables 1 and 2, the plurality of EDC pattern signal parameters included in the mode signal may indicate the pattern information and period information regarding the EDC pattern signal. Based on Tables 1 and 2, the EDC pattern generator 600 may generate the EDC pattern signal obtained by periodically repeating the signal pattern corresponding to the first EDC pattern signal parameter bits A0 and A1 with a signal period having a number of cycles indicated by the second EDC pattern signal parameter bits A2 and A3.

For example, when the EDC mode data A0, A1, A2, and A3 are 0, 1, 0, and 0, respectively, the EDC pattern generator 600 may generate an EDC pattern signal obtained by continuously repeating a signal pattern '0101'. Also, when the EDC mode data A0, A1, A2, and A3 are 0, 1, 1, and 0, respectively, the EDC pattern generator 600 may generate an EDC pattern signal having a signal period of a total of 16 cycles, which is disabled for a hold period of 12 cycles after generation of the signal pattern '0101'.

When the EDC mode data A0, A1, A2, and A3 are 0, 1, 0, and 1, respectively, the EDC pattern generator 600 may generate an EDC pattern signal having a signal period of a total of 32 cycles, which is disabled for a hold period of 28 cycles after generation of the signal pattern '0101'. Finally, when the EDC mode data A0, A1, A2, and A3 are 0, 1, 1, and 1, respectively, the EDC pattern generator 600 may generate an EDC pattern signal having a signal period of a total of 64 cycles, which is disabled for a hold period of 60 cycles after generation of the signal pattern '0101'. The above-described construction and operation of EDC pattern generator 600 will be described later in further detail with reference to FIGS. 9 through 16.

Figure 8:
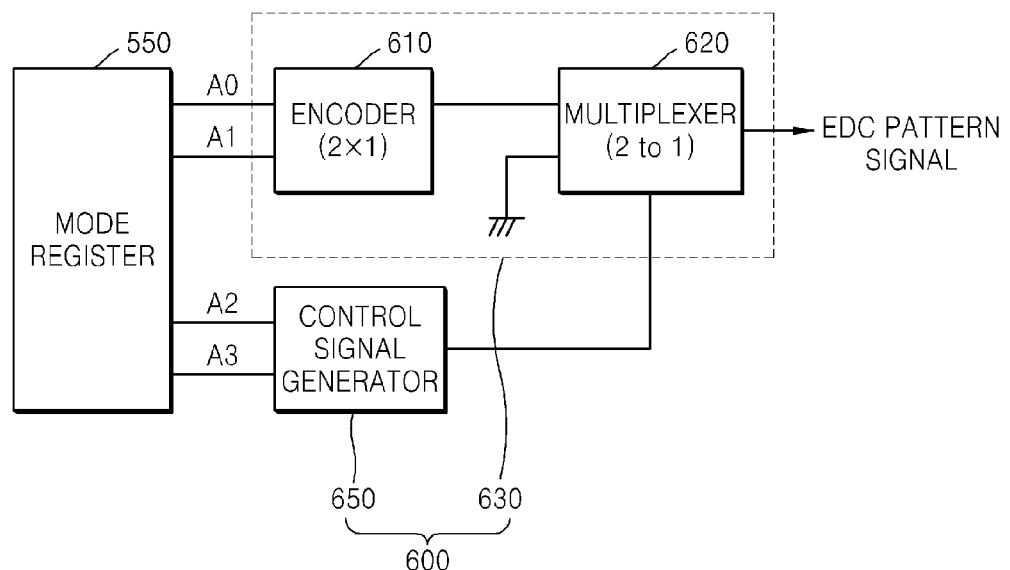
FIG. 8 is a block diagram of a memory device according to other exemplary embodiments of the inventive concept.

FIG. 8 is a block diagram of a portion of memory device 500 according to another exemplary embodiment of the inventive concept. Memory device 500 of FIG. 8 may be a modified example of memory device 500 of FIGS. 1 through 5. Hereinafter, a repeated description of the same components as in FIGS. 1 through 5 will be omitted.

Referring to FIG. 8, EDC pattern generator 600 may include a synthesizer 630 and a control signal generator 650.

Synthesizer 630 may receive the first EDC pattern signal parameter bits A0 and A1 of EDC mode data of the mode register 550 and generate therefrom an EDC pattern signal. More specifically, for example, as shown in Table 1, synthesizer 630 may be configured to output a signal pattern obtained by repeating the first EDC pattern signal parameter bits A0 and A1. Synthesizer 630 may receive an operation signal generated by control signal generator 650 and periodically output the signal pattern corresponding to first EDC pattern signal parameter bits A0 and A1 at predetermined signal periods in response to the operation signal.

More specifically, for example, when the first EDC pattern signal parameter bits A0 and A1 are applied to synthesizer 630, synthesizer 630 may output the signal pattern corresponding to first EDC pattern signal parameter bits A0 and A1 using an encoder 610. However, the synthesizer 630 may further include a multiplexer 620 having a first input connected to an output of encoder 610 to output the signal pattern, and having a second input connected to ground to maintain a disabled state at the output terminal of the multiplexer 620, to thereby output an EDC pattern signal wherein the signal pattern corresponding to first EDC pattern signal parameter bits A0 and A1 is periodically repeated at the predetermined signal period.

Multiplexer 620 may receive the operation signal from the control signal generator 650 and in response thereto may multiplex between the output of encoder 610 and ground and thereby generate the EDC pattern signal. For instance, when the operation signal is enabled, multiplexer 620 may output the signal pattern corresponding to first EDC pattern signal parameter bits A0 and A1 generated from the output terminal of the encoder 610. On the other hand, when the operation signal is disabled, multiplexer 620 may output a ground signal, that is, a disabled signal.

Control signal generator 650 may receive second EDC pattern signal parameter bits A2 and A3 of the EDC mode data of the mode register 550 and generate therefrom the operation signal required for synthesizer 630. More specifically, when second EDC pattern signal parameter bit A2 and/or A3 is enabled, control signal generator 650 may generate an operation signal enabled for a first active period and then disabled for a hold period. In contrast, when second EDC pattern signal parameter bits A2 and A3 are both disabled, control signal generator 650 may generate an operation signal enabled for a second active period different from the first active period, e.g., for the entire signal period.

As a result, multiplexer 620 may operate in response to the operation signal generated by control signal generator 650, and the EDC pattern signal generated by multiplexer 620 may be a signal obtained by periodically repeating a signal pattern corresponding to the first EDC pattern signal parameter bits A0 and A1 at a signal period corresponding to the second EDC pattern signal parameter bits A2 and A3. Configuration and operation of EDC pattern generator 600 will now be described in further detail with reference to FIGS. 9 through 16.

Figure 9:
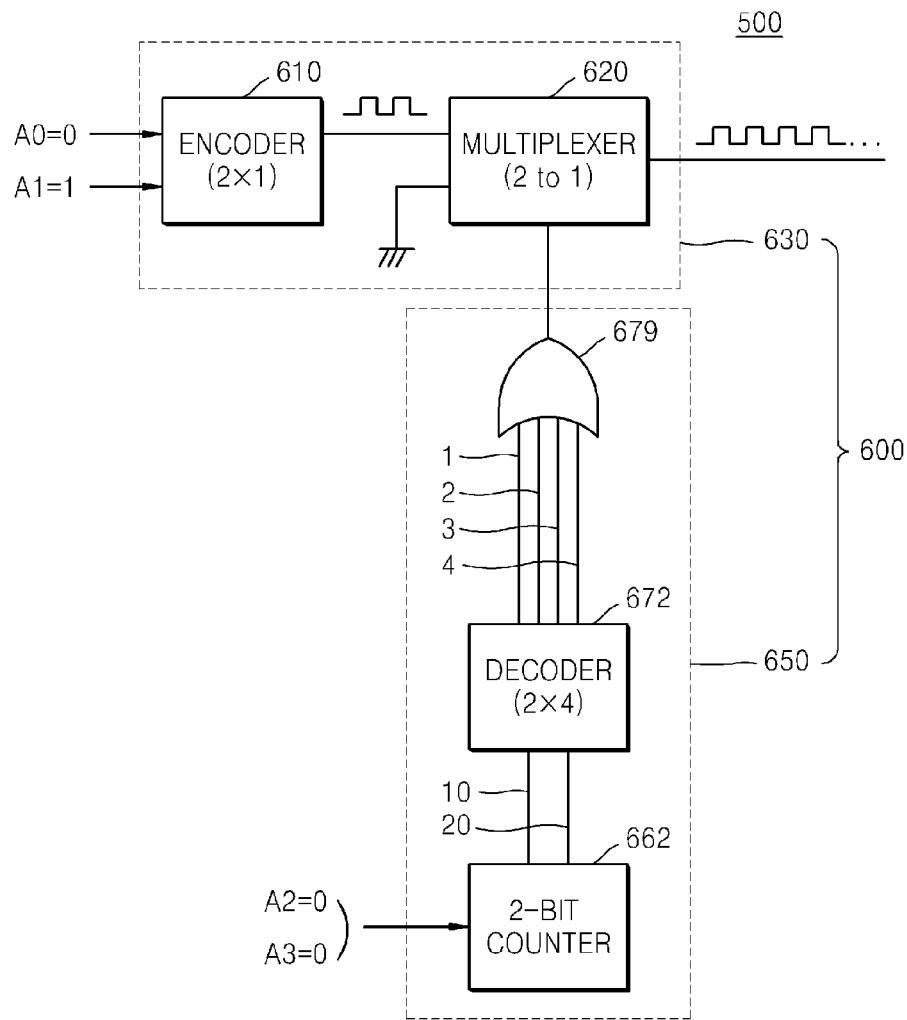
FIG. 9 is a block diagram of a memory device according to other exemplary embodiments of the inventive concept.
Figure 10:
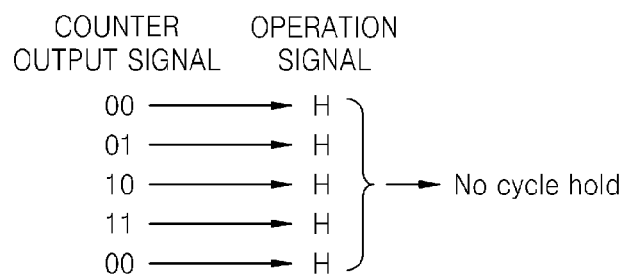
FIG. 10 is a schematic diagram of an operation of a decoder of FIG. 9.

FIG. 9 illustrates a schematic construction diagram of EDC pattern generator 600 of memory device 500, according to a modified embodiment of FIG. 8. In particular, when the first EDC pattern signal parameter bits A0 and A1, and the second EDC pattern signal parameter bits A2 and A3, are 0, 1, 0, and 0, respectively, EDC pattern generator 600 may be configured to generate an EDC pattern signal obtained by continuously repeating a signal pattern '0101'. Also, FIG. 10 illustrates a schematic operation of a decoder 672 of FIG. 9. Hereinafter, a repeated description of the same components as in FIG. 8 will be omitted.

Referring to FIG. 9, for example when the first EDC pattern signal parameter bits A0 and A1 are 0 and 1, respectively, encoder 610 may generate a signal pattern '01'. The signal pattern '01' may be applied to multiplexer 620, which may output the signal pattern '01' when an operation signal is enabled, and output a ground signal (i.e., disabled signal) when the operation signal is disabled.

When the second EDC pattern signal parameter bits A2 and A3 are both 0, control signal generator 650 of EDC pattern generator 600 may employ a 2-bit counter 662 to generate the operation signal. Decoder 672 may be connected between 2-bit counter 662 and multiplexer 620. Decoder 672 may generate decoded output signals in response to output signals of output terminals 10 and 20 of 2-bit counter 662, and OR gate 679 may OR these decoded signals together to transmit the operation signal to multiplexer 620.

Referring to FIGS. 9 and 10, decoder 672 and OR gate 679 may be configured to output a continuously enabled operation signal when 2-bit counter 662 outputs an output signal having a period of 4 cycles.

For example, when decoder 672 is a 2×4 decoder, as the value of the output signal of 2-bit counter 662 increases, i.e., as the output signal of 2-bit counter 662 increases from 00 to 01 to 10 to 11, decoder 672 may output decoded output signals to respective output terminals 1, 2, 3, and 4. OR gate 679 may be connected between output terminals 1, 2, 3, and 4 of decoder 672 and multiplexer 620 and apply a continuously enabled operation signal to multiplexer 620. Accordingly, an EDC pattern signal generated by multiplexer 620 may be a signal obtained by continuously repeating the first EDC pattern signal parameter bits A0 and A1.

FIG. 11 is a schematic construction diagram of EDC pattern generator 600, according to a modified embodiment of FIG. 9. When the first EDC pattern signal parameter bits A0 and A1, and the second EDC pattern signal parameter bits A2 and A3, are 0, 1, 1, and 0, respectively, EDC pattern generator 600 may be configured to generate an EDC pattern signal obtained by periodically repeating a signal pattern '0101' at a signal period of 16 cycles, with a hold period of 12 cycles between adjacent signal patterns. Also, FIG. 12 illustrates a schematic operation of a decoder 674 of FIG. 11. Hereinafter, a repeated description of the same components as in FIG. 9 will be omitted.

Referring to FIG. 11, when the first EDC pattern signal parameter bits A0 and A1 are 0 and 1, respectively, an encoder 610 may generate signal pattern '01'. Multiplexer 620 may receive the signal pattern '01', output the signal pattern '01' when an operation signal is enabled, and output a ground signal (i.e., disabled signal) when the operation signal is disabled.

When the second EDC pattern signal parameter bits A2 and A3 are 1 and 0, respectively, control signal generator 650 of EDC pattern generator 600 may employ a 4-bit counter 664 to generate an operation signal. Decoder 674 may be connected between 4-bit counter 664 and multiplexer 620. Decoder 674 may generate decoded output signals in response to an output signal of 4-bit counter 664, and OR gate 679 may OR these decoded signals together to transmit the operation signal to multiplexer 620.

Referring to FIGS. 11 and 12, when 4-bit counter 664 outputs output decoded output signal having a signal period of 16 cycles, decoder 674 and OR gate 679 may be configured to output a periodic operation signal that is enabled for an initial four cycles comprising an active period, and then disabled for the remaining 12 cycles comprising a hold period.

For example, when decoder 674 is a 4×16 decoder, as the output signal of 4-bit counter 664 increases, i.e., as the output signal of 4-bit counter 664 increases from 0000 to 0001 to ... to 1111, decoder 674 may output decoded output signals to respective output terminals 1 to 16. OR gate 679 may be connected to first through fourth output terminals 1, 2, 3, and 4 of decoder 674 and apply an operation signal enabled for 4 cycles to multiplexer 620. Since fifth through sixteenth output terminals 5 through 16 are not connected to OR gate 679 and multiplexer 620, the operation signal applied to multiplexer 620 may remain disabled for the remaining 12 cycles of 4-bit counter 664.

As a result, multiplexer 620 may receive the operation signal, which is periodically enabled for 4 cycles and disabled for 12 cycles, and may generate therefrom a periodic EDC pattern signal with a signal period of 16 cycles. Accordingly, the EDC pattern signal generated by multiplexer 620 may be a periodic signal having a signal period of a total of 16 cycles, which is obtained by repeating the first EDC pattern signal parameter bits A0 and A1 over an active period of 4 cycles and then remaining disabled for the remaining 12 cycles of the signal period of 16 cycles.

FIG. 13 is a schematic construction diagram of EDC pattern generator 600, according to a modified embodiment of FIG. 11. When first EDC pattern signal parameter bits A0 and A1, and second EDC pattern signal parameter bits A2 and A3 are 0, 1, 0, and 1, respectively, EDC pattern generator 600 may be configured to generate an EDC pattern signal obtained by periodically repeating a signal pattern '0101' at a signal period of 32 cycles, with a hold period of 28 cycles between adjacent signal patterns. Also, FIG. 14 illustrates a schematic operation of a decoder 675 of FIG. 13. Hereinafter, a repeated description of the same components as in FIG. 11 will be omitted.

Referring to FIG. 13, when the first EDC pattern signal parameter bits A0 and A1 are 0 and 1, respectively, encoder 610 may generate a signal pattern '01'. Multiplexer 620 may receive the signal pattern '01', output the signal pattern '01' when an operation signal is enabled, and output a ground signal (i.e., disabled signal) when the operation signal is disabled.

When the second EDC pattern signal parameter bits A2 and A3 are 0 and 1, respectively, signal generator 650 of the EDC pattern generator 600 may employ a 5-bit counter 665 to generate an operation signal. Decoder 675 may be connected between 5-bit counter 665 and multiplexer 620. Decoder 675 may generate decoded output signals in response to an output signal of 5-bit counter 665, and OR gate 679 may OR these decoded signals together to transmit the operation signal to multiplexer 620.

Referring to FIGS. 13 and 14, as 5-bit counter 665 outputs an output signal having a signal period of 32 cycles, decoder 675 and OR gate 679 may be configured to output a periodic operation signal that is enabled for an initial 4 cycles comprising an active period, and then disabled for the remaining 28 cycles comprising a hold period.

For example, when decoder 675 is a 5×32 decoder, as the output signal of 5-bit counter 665 increases, i.e., as the output signal of 5-bit counter 665 increases from 00000 to 00001 to ... to 11111, decoder 675 may output decoded output signals to respective output terminals 1 to 32. OR gate 679 may be connected to first through fourth output terminals 1, 2, 3, and 4 of decoder 675 and apply an enabled operation signal to multiplexer 620 for 4 cycles. Since fifth through thirty-second output terminals 5 to 32 are not connected to OR gate 679 and the multiplexer 620, the operation signal applied to multiplexer 620 may remain disabled for the remaining 28 cycles of 5-bit counter 665.

As a result, the multiplexer 620 may receive the operation signal, which is periodically enabled for 4 cycles and disabled for 28 cycles, and may generate therefrom a periodic EDC pattern signal with a signal period of 32 cycles. Accordingly, the EDC pattern signal generated by the multiplexer 620 may be a periodic signal having a signal period of a total of 32 cycles, which is obtained by repeating the first EDC pattern signal parameter bits A0 and A1 over an active period of 4 cycles and then remaining disabled for the remaining 28 cycles of the signal period of 32 cycles.

FIG. 15 is a schematic construction diagram of EDC pattern generator 600, according to a modified embodiment of FIG. 13. When first and second EDC pattern signal parameter bits A0 and A1, and second EDC pattern signal parameter bits A2 and A3 are 0, 1, 1, and 1, respectively, EDC pattern generator 600 may be configured to generate an EDC pattern signal obtained by repeating a signal pattern '0101' at a signal period of 64 cycles, with a hold period of 60 cycles between adjacent signal patterns. Also, FIG. 16 illustrates a schematic operation of a decoder 676 of FIG. 15. Hereinafter, a repeated description of the same components as in FIG. 13 will be omitted.

Referring to FIG. 15, when the first EDC pattern signal parameter bits A0 and A1 are 0 and 1, respectively, encoder 610 may generate a signal pattern '01'. Multiplexer 620 may receive the signal pattern '01', output the signal pattern '01' when an operation signal is enabled, and output a ground signal (i.e., disabled signal) when the operation signal is disabled.

When the second EDC pattern signal parameter bits A2 and A3 are 1 and 1, respectively, control signal generator 650 of EDC pattern generator 600 may employ a 6-bit counter 666 to generate an operation signal. Decoder 676 may be connected between 6-bit counter 666 and multiplexer 620. Decoder 676 may generate decoded output signals in response to an output signal of 6-bit counter 666, and OR gate 679 may OR these decoded output signals together to transmit the operation signal to multiplexer 620.

Referring to FIGS. 15 and 16, as 6-bit counter 666 outputs an output signal having a signal period of 64 cycles, decoder 676 and OR gate 679 may be configured to output a periodic operation signal that is enabled for an initial 4 cycles comprising an active period, and then disabled for the remaining 60 cycles comprising a hold period.

For example, when decoder 676 is a 6×64 decoder, as an output signal of 6-bit counter 666 increases, i.e., as the output signal of 6-bit counter 666 increases from 000000 to 000001 to . . . to 111111, decoder 676 may output decoded output signals to each output terminal. OR gate 679 may be connected to first through fourth output terminals 1, 2, 3, and 4 of decoder 676 and apply an operation signal enabled for 4 cycles to multiplexer 620. Since fifth through sixty-fourth output terminals 5 to 64 are not connected to OR gate 679 and multiplexer 620, the operation signal applied to multiplexer 620 may remain disabled for the remaining 60 cycles of the 6-bit counter 666.

As a result, multiplexer 620 may generate an operation signal, which is enabled for 4 cycles and disabled for 60 cycles, and may generate therefrom an EDC pattern signal with a signal period of 64 cycles. Accordingly, the EDC pattern signal generated by multiplexer 620 may be a signal having a signal period of a total of 64 cycles, which is obtained by repeating first bit signals A0 and A1 for 4 cycles and then remaining disabled for the remaining 60 cycles of the signal period of 64 cycles.

Figure 17:
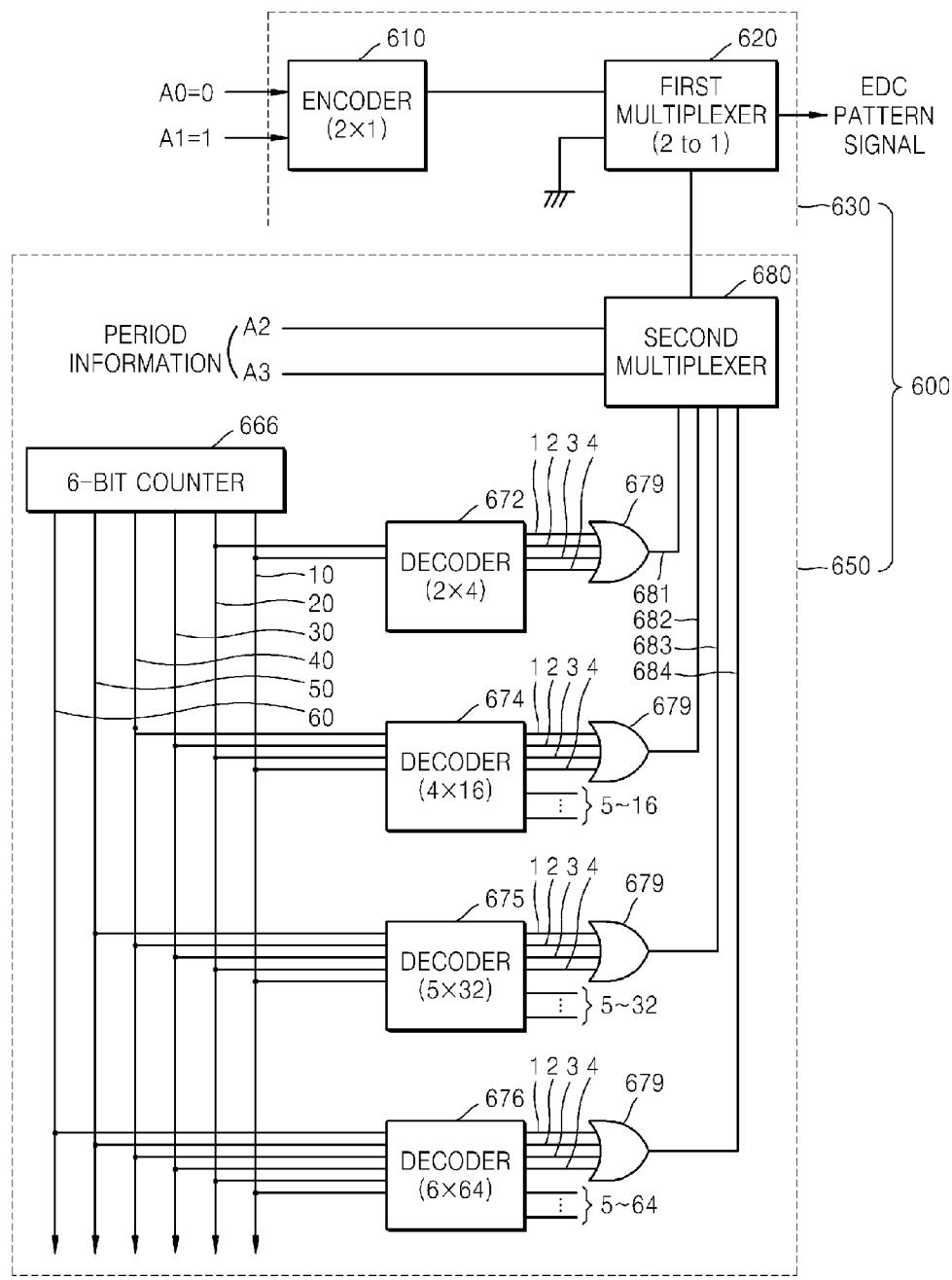
FIG. 17 is a block diagram of a memory device according to other exemplary embodiments of the inventive concept.

FIG. 17 is a schematic block diagram of memory device 500 according to another exemplary embodiment of the inventive concept. Memory device 500 may implement a combination of EDC pattern generators 600 described with reference to FIGS. 9 through 16. Hereinafter, a repeated description of the same components as in FIGS. 9 through 16 will be omitted.

To begin with, when second EDC pattern signal parameter bits A2 and A3 indicating period information are defined as shown in Table 2, in the embodiments shown in FIGS. 9 through 16, to apply an operation signal having a predetermined period to multiplexer 620, 2-bit counter 662 through 6-bit counter 666 were respectively used according to the second EDC pattern signal parameter bits A2 and A3. However, in the embodiment of FIG. 17, only 6-bit counter 666 may be used. Furthermore, the inventive concept is not limited thereto, and an n-bit counter (here, n is 6 or greater) may be used instead of 6-bit counter 666.

For example, when the second EDC pattern signal parameter bits A2 and A3 are 0 and 0, respectively (i.e., when a continuously enabled operation signal is applied to multiplexer 620), first and second output terminals 10 and 20 of the 6-bit counter 666 may be connected to decoder 672, and decoded output signals of first through fourth output terminals 1, 2, 3, and 4 of decoder 672 may be applied through OR gate 679 to a first input terminal 681 of a second multiplexer 680 as a combined decoded signal. In this case, when the second EDC pattern signal parameter bits A2 and A3 are 0 and 0, respectively, second multiplexer 680 selects the combined decoded signal at first input terminal 681 as the operation signal. Accordingly, a continuously enabled operation signal may be applied to multiplexer 620. As a result, an EDC pattern signal generated by multiplexer 620 may be a signal obtained by continuously repeating the first EDC pattern signal parameter bits A0 and A1.

When the second EDC pattern signal parameter bits A2 and A3 are 1 and 0, respectively (i.e., when an operation signal, which is enabled for an active period of 4 cycles and remains disabled for a hold period of 12 cycles, is to be applied to multiplexer 620), first through fourth output terminals 10, 20, 30, and 40 of 6-bit counter 666 may be connected to decoder 674, and decoded output signals of first through fourth output terminals 1, 2, 3, and 4 of decoder 674 may be applied through OR gate 679 to a second input terminal 682 of second multiplexer 680 as a combined decoded signal. In this case, since the second EDC pattern signal parameter bits A2 and A3 are 1 and 0, respectively, second multiplexer 680 selects the combined decoded signal at second input terminal 682 as the operation signal. Accordingly, an operation signal, which is enabled for 4 cycles and remains disabled for 12 cycles, may be applied to the multiplexer 620. As a result, an EDC pattern signal generated by the multiplexer 620 may be a periodic signal having a signal period of a total of 16 cycles, which is obtained by repeating the first EDC pattern signal parameter bits A0 and A1 during the active period of 4 cycles and remaining is a disabled state for the remaining 12 cycles of the signal period.

When the second EDC pattern signal parameter bits A2 and A3 are 0 and 1 (i.e., when an operation signal, which is enabled for 4 cycles and remains disabled for 28 cycles, is to be applied to the multiplexer 620), first through fifth output terminals 10, 20, 30, 40, and 50 of 6-bit counter 666 may be connected to decoder 675, and decoded output signals of first through fourth output terminals 1, 2, 3, and 4 of decoder 675 may be applied through OR gate 679 to a third input terminal 683 of second multiplexer 680 as a combined decoded signal. In this case, when the second EDC pattern signal parameter bits A2 and A3 are 0 and 1, respectively, second multiplexer 680 selects the combined decoded signal at third input terminal 683 as the operation signal. Accordingly, an operation signal, which is enabled for an active period of 4 cycles and remains disabled for a hold period of 28 cycles, may be applied to multiplexer 620. As a result, an EDC pattern signal generated by the multiplexer 620 may be a periodic signal having a signal period of a total of 32 cycles, which is obtained by repeating the first EDC pattern signal parameter bits A0 and A1 during the active period of 4 cycles and remaining in a disabled state for the remaining 28 cycles of the signal period.

When the second EDC pattern signal parameter bits A2 and A3 are 1 and 1, respectively (i.e., when an operation signal, which is enabled for 4 cycles and remains disabled for 60 cycles, is to be applied to multiplexer 620), first through sixth output terminals 10, 20, 30, 40, 50, and 60 of 6-bit counter 666 may be connected to decoder 676, and decoded output signals of first through fourth output terminals 1, 2, 3, and 4 of decoder 676 may be applied through OR gate 679 to a fourth input terminal 684 of second multiplexer 680 as a combined decoded signal. In this case, when the second EDC pattern signal parameter bits A2 and A3 are 1 and 1, respectively, second multiplexer 680 selects the combined decoded signal at fourth input terminal 684 as the operation signal. Accordingly, an operation signal, which is enabled for an active period of 4 cycles and remains disabled for a hold period of 60 cycles, may be applied to multiplexer 620. As a result, an EDC pattern signal generated by the multiplexer 620 may be a periodic signal having a signal period of a total of 64 cycles, which is obtained by repeating the first EDC pattern signal parameter bits A0 and A1 during the active period of 4 cycles and remaining in a disabled state for the remaining 60 cycles of the signal period.

It should be noted that the embodiments shown in FIGS. 9 through 17 are only examples of an EDC pattern generator configured to generate a signal obtained by repeating a signal pattern obtained based on pattern information for a signal period obtained based on period information. Accordingly, it will be understood by those skilled in the art that the EDC pattern generator may be configured in other equivalent circuit diagrams than shown in FIGS. 9 through 17.

Figure 18:
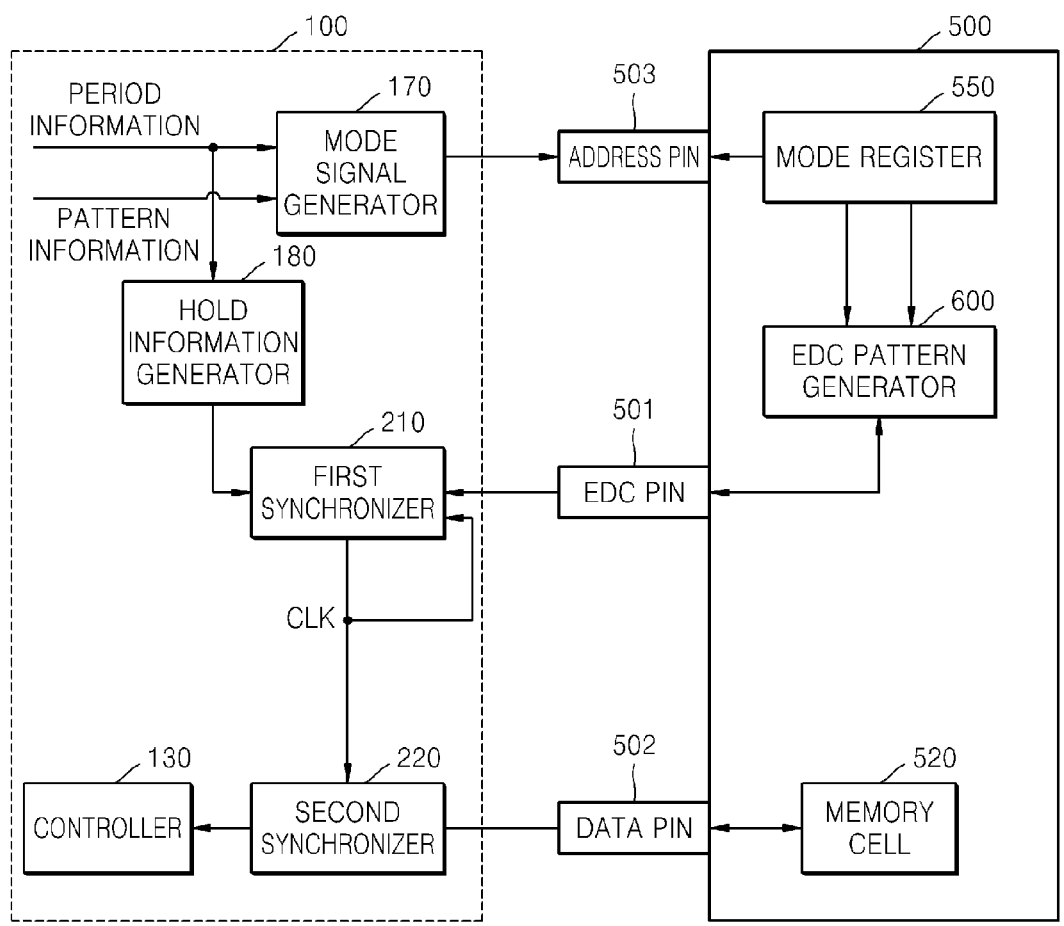
FIG. 18 is a block diagram of a memory device and a memory control unit according to other exemplary embodiments of the inventive concept.

FIG. 18 is a block diagram of memory device 500 and memory control unit 100 according to other exemplary embodiments of the inventive concept. Memory device 500 and memory control unit 100 of FIG. 18 may be modified examples of the embodiments of FIGS. 2 through 6. A repeated description of the same components as in FIGS. 2 through 6 will be omitted.

Referring to FIG. 18, memory control unit 100 may further include a hold information generator 180 configured to receive period information and generate an operation signal of first synchronizer 210. In this case, an operation signal of first synchronizer 210 may be enabled at a period obtained based on the period information. Accordingly, first synchronizer 210 may synchronize an edge of a clock signal with an edge of an EDC pattern signal at the period obtained based on the period information.

Figure 19:
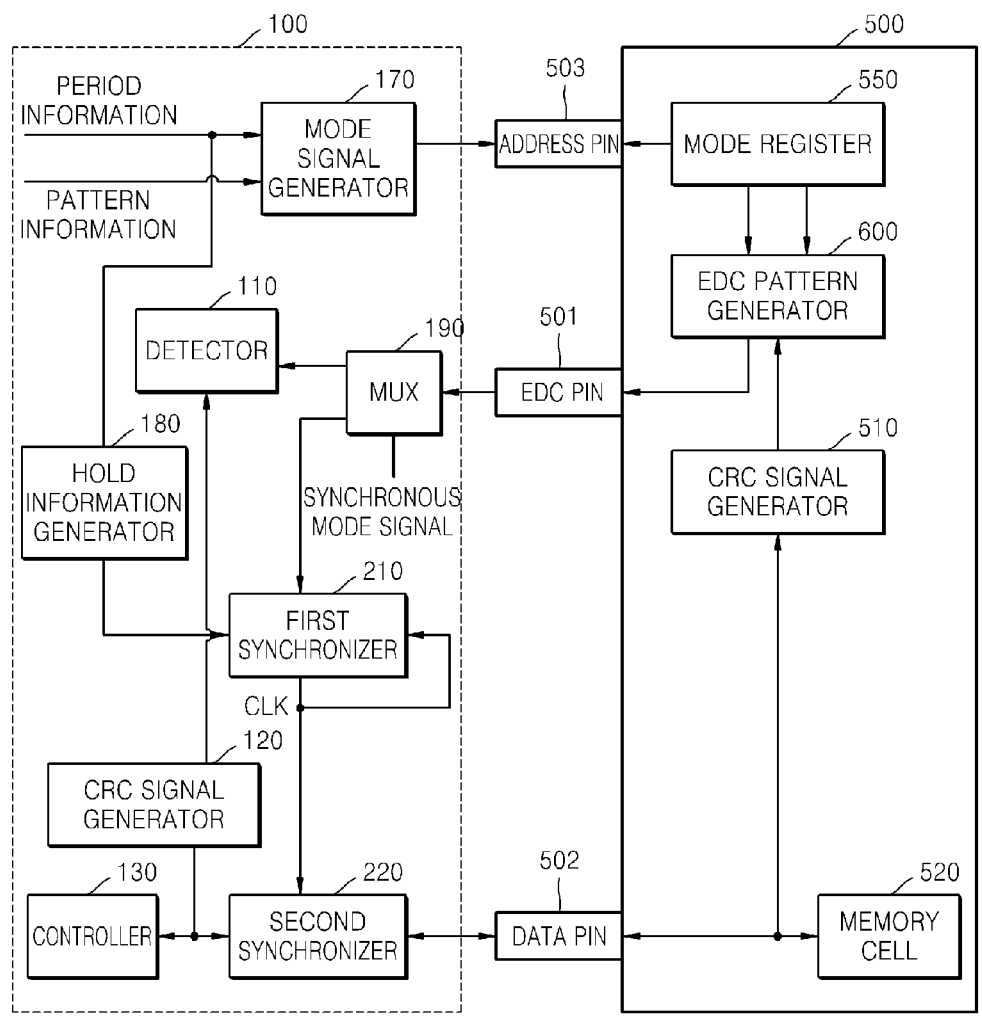
FIG. 19 is a block diagram of a memory device and a memory control unit according to other exemplary embodiments of the inventive concept.

FIG. 19 is a block diagram of a memory device and a memory control unit according to other exemplary embodiments of the inventive concept. Memory device 500 and memory control unit 100 of FIG. 19 may be modified examples of the embodiment of FIG. 18. Hereinafter, a repeated description of the same components as in FIG. 18 will be omitted.

Referring to FIG. 19, memory device 500 and memory control unit 100 may function to detect transmission errors and to compensate for a data eye drift in a data signal. That is, memory device 500 and memory control unit 100 may compare a CRC signal generated using a data signal of a data line (not shown) with a CRC signal included in an EDC pattern signal, to detect transmission errors. Also, memory device 500 and memory control unit 100 may synchronize the EDC pattern signal with a clock signal to compensate for a data eye drift in the data signal caused, for example, by changes in temperature.

Although both of these functions (i.e., data error detection and data eye drift compensation) may be performed using the EDC pattern signal, the functions may be performed using different elements. Specifically, a first set of elements configured to detect transmission errors may include a CRC signal generator 120 and a detector 110 connected to the data line, while a second set of elements configured to compensate for a temperature effects on the data eye pattern may include first synchronizer 210 and hold information generator 180. Accordingly, memory control unit 100 may further include a multiplexer 190 configured to output the EDC pattern signal to detector 110 and first synchronizer 210 depending on whether a synchronous mode signal is enabled or not.

When the synchronous mode signal is enabled, the multiplexer 190 may transmit the EDC pattern signal to the first synchronizer 210. In this case, first synchronizer 210 and hold information generator 180 may serve a temperature compensation function. In contrast, when the synchronous mode signal is disabled, the multiplexer 190 may transmit the EDC pattern signal to the detector 110. In this case, the CRC signal generator 120 and the detector 110 may serve a transmission error detection function.

Although the inventive concept discloses an aspect in which the first synchronizer synchronizes a clock signal with an EDC pattern signal transmitted by EDC pin 501, the inventive concept is not limited thereto. For example, first synchronizer 210 may synchronize the clock signal with a data signal transmitted by a data pin 502 instead of the EDC pattern signal.

Figure 20:
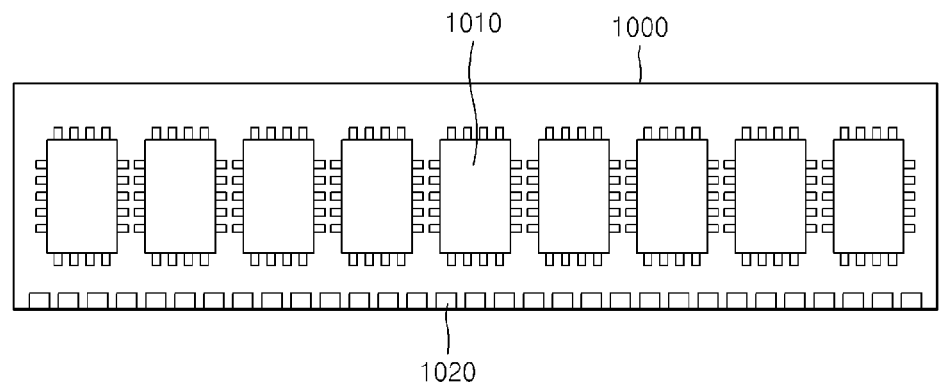
FIG. 20 is a front view of a memory module including a memory device, according to an embodiment of the inventive concept.

FIG. 20 is a front view of a memory module 1000 including memory device 500, according to an embodiment of the inventive concept.

Referring to FIG. 20, memory module 1000 may include a plurality of memory chips 1010 and a plurality of external terminals 1020. Each of memory chips 1010 may include memory device 500. Each of external terminals 1020 may be electrically connected to memory device 500 in each of memory chips 1010. External terminals 1020 may be connected to a computing system (not shown) and transmit a control signal, an address signal, and data signals from the computing system to memory device 500. Also, external terminals 1020 may transmit the data signals stored in memory device 500 of each of memory chips 1010 to the computing system.

Figure 21:
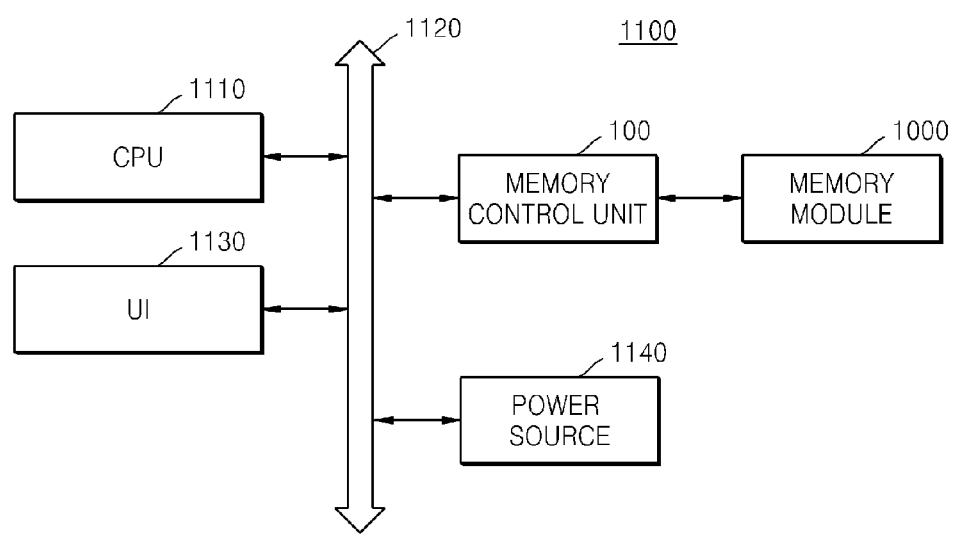
FIG. 21 is a block diagram of a computing system including the memory module of FIG. 20, according to an embodiment of the inventive concept.

FIG. 21 is a block diagram of a computing system 1100 including memory module 1000 of FIG. 20, according to an embodiment of the inventive concept.

Referring to FIG. 21, computing system 110 may include a central processing unit (CPU) 1110, a user interface (UI) 1130, a power source 1140, memory control unit 100, and memory module 1000.

Memory module 1000 may be connected to a system bus 1120 through memory control unit 100 and ultimately electrically connected to CPU 1110, user interface 1130, and power source 1140. Data provided through user interface 1130 or processed by CPU 1110 may be stored in memory module 1000. Although not shown, computing system 1100 according to the inventive concept may further include an application chipset and a camera image processor.

It should be understood that shapes of respective portions of the appended drawings are only provided as examples for clarity and may be changed into various other shapes. Like numbers refer to lime elements throughout.

Due to a temperature variation of a memory device or memory control unit, a signal distortion, such as a timing skew, may occur in a data signal transmitted by a data pin. In this case, a clock signal may be restored or compensated for in response to an EDC pattern signal transmitted through an EDC pin from a memory device according to embodiments of the inventive concept. By synchronizing the restored or compensated clock signal with the data signal, a data eye drift may be removed from the data signal having the timing skew.

Furthermore, a memory device according to embodiments of the inventive concept may generate a periodic EDC pattern signal obtained by repeating a signal pattern obtained based on pattern information for a signal period obtained based on period information. Thus, the EDC pattern signal may remain disabled at intervals of the signal period, and the number of times the EDC pattern signal is toggled may be minimized. As a result, a power reduction effect can be attained.

While the inventive concept has been particularly shown and described with reference to exemplary embodiments thereof, it will be understood that various changes in form and details may be made therein without departing from the spirit and scope of the following claims.

What is claimed is:

1. A device, comprising:
   a mode register configured to store an error detection and correction (EDC) mode data, including pattern information and period information for an EDC pattern; and
   an EDC pattern generator configured to receive the pattern information and the period information and to generate the EDC pattern signal based on the pattern information and the period information,
   wherein the EDC pattern signal is a periodic signal comprising a series of signal periods based on the period information, wherein at least one signal period includes an active period and a hold period, wherein the EDC pattern signal includes in the active period a signal pattern based on the pattern information, and wherein the EDC pattern signal is in a disabled state during the hold period,
   wherein the pattern information comprises a first EDC pattern signal parameter including first EDC pattern signal parameter bits,
   wherein the signal pattern is obtained by repeating the first EDC pattern signal parameter bits during the active period, and
   wherein the EDC pattern generator comprises:
      a synthesizer configured to receive the first EDC pattern signal parameter bits and to output the first EDC pattern signal; and
      a control signal generator configured to output a periodic operation signal to the synthesizer wherein a period of the operation signal is based on the period information.

2. The device of claim 1, wherein the synthesizer is further configured to output the first EDC pattern signal parameter bits when the operation signal is enabled, and wherein the synthesizer outputs a ground signal when the operation signal is disabled.

3. The device of claim 2, wherein the pattern information comprises a second EDC pattern signal parameter including second EDC pattern signal parameter bits,
   wherein the operation signal is enabled for a first period when one of the second EDC pattern signal parameter bits is enabled,
   and the operation signal is enabled for a second period different from the first period when none of the second EDC pattern signal parameter bits are enabled.

4. The device of claim 1, wherein the control signal generator includes a counter.

5. The device of claim 1, further comprising:
   at least one memory cell;
   a data pin connected to the at least one memory cell and configured to transmit a data signal to the at least one memory cell; and
   a cyclic-redundancy-check (CRC) signal generator connected to the data pin and configured to generate CRC information regarding the data signal.

6. The device of claim 5, wherein the EDC pattern generator is connected to the CRC signal generator and further configured to generate the EDC pattern signal including the CRC information.

7. A device comprising:
   a mode register configured to store error detection and correction (EDC) mode data including pattern information and period information;
   a synthesizer configured to generate a periodic EDC pattern signal for receiving data stored in the at least one memory cell, wherein the EDC pattern signal has a signal period based on the period information, and has a signal pattern based on the pattern information; and
   a control signal generator configured to generate an operation signal for the synthesizer at intervals of the signal period based on the period information,
   wherein the EDC pattern signal generated by the synthesizer is a signal obtained by repeating the signal pattern at a periodic rate corresponding to the signal period.

8. The device of claim 7, wherein the signal pattern is repeated throughout each signal period.

9. The device of claim 8, wherein the signal period includes an active period and a hold period, wherein the EDC pattern signal includes the signal pattern in the active period, and wherein the EDC pattern signal is fixed at one logic level for a duration of the hold period.

10. The device of claim 9, wherein the active period has a duration of 4 clock cycles, and wherein the hold period has a duration which is one of 12 clock cycles, 28 clock cycles, and 60 clock cycles.

11. The device of claim 7, wherein the synthesizer comprises:
    an encoder configured to receive the pattern information and in response thereto to output the signal pattern; and
    a multiplexer having a first input connected to an output of the encoder and having a second input connected to a fixed voltage, and
    wherein the multiplexer is configured to selectively switch between the first input and the second input in response to the operation signal.

12. The device of claim 7, wherein the control signal generator comprises:
    a counter configured to generate an output count that repeatedly increments from a minimum value to a maximum value;
    at least one decoder configured to decode the output count to generate decoded output signals; and
    at least one logic gate configured to logically combine two or more of the decoded output signals to generate the operation signal.

13. The device of claim 12, wherein the at least one decoder comprises a plurality of decoders each configured to generate a corresponding plurality of the decoded output signals and wherein the at least one logic gate comprises a plurality of logic gates each corresponding to one of the plurality of decoders and each outputting a combined decoded signal, and wherein the control signal generator further comprises a multiplexer configured to receive the period information and in response thereto to select one of the combined decoded signals as the operation signal.

14. An apparatus, comprising:
    a first device, including
       at least one input configured to receive error detection and correction (EDC) mode data, including pattern information and period information for an EDC pattern signal; a
       an error detection and correction (EDC) generator configured to generate an EDC pattern signal based on the EDC mode data; and
       at least one output configured to output the EDC pattern signal,
    wherein, in a synchronization mode, the EDC pattern signal is a periodic signal comprising a series of signal periods based on the period information, wherein at least one signal period includes an active period and a hold period, wherein the EDC pattern signal includes in the active period a signal pattern based on the pattern information, and wherein the EDC pattern signal remains at a fixed logic level throughout a duration of the hold period.

15. The apparatus of claim 14, wherein the first device is a memory device further comprising:
  at least one memory cell;
  at least one data pin configured to output data from the at least one memory cell; and
  a first cyclic-redundancy-check (CRC) signal generator configured to generate first CRC information regarding the output data,
  wherein the CRC signal generator is operatively connected to the EDC pattern generator, and
  wherein, in a data transmission mode, the EDC pattern signal includes the CRC information.

16. The apparatus of claim 15, wherein the memory device further comprises a mode register configured to store the EDC data.

17. The apparatus of claim 16, further comprising a memory control unit operatively connected to the memory device, and wherein the memory control unit comprises a mode signal generator configured to transmit the EDC mode data to the memory device.

18. The apparatus of claim 17, wherein the memory control unit further comprises a first synchronizer configured, in the synchronization mode, to synchronize a clock of the memory control unit to the signal pattern of the EDC pattern signal received from the at least one output of the memory device.

19. The apparatus of claim 18, wherein the memory control unit further comprises:
  a second CRC signal generator configured to derive second CRC information from the output data of the memory device; and
  a detector configured, in the data transmission mode, to receive the EDC pattern signal and to extract the first CRC information therefrom, and to receive the second CRC information from the second CRC signal generator, and to compare the first CRC information to the second CRC information to determine where the output data is received correctly.

20. The apparatus of claim 19, wherein the memory control unit further comprises a multiplexer configured to receive the EDC pattern signal and, in response to a synchronous mode signal, to selectively provide the EDC pattern signal to one of the first synchronizer and the detector.

* * * * *